(12) United States Patent
Sorg et al.

(10) Patent No.: US 8,541,809 B2
(45) Date of Patent: Sep. 24, 2013

(54) LIGHT-EMITTING SURFACE ELEMENT AND METHOD FOR PRODUCING A LIGHT-EMITTING SURFACE ELEMENT

(75) Inventors: Jorg E. Sorg, Regensburg (DE); Stefan Gruber, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 232 days.

(21) Appl. No.: 12/679,774

(22) PCT Filed: Sep. 26, 2008

(86) PCT No.: PCT/DE2008/001589
§ 371 (c)(1),
(2), (4) Date: Apr. 19, 2010

(87) PCT Pub. No.: WO2009/039846
PCT Pub. Date: Apr. 2, 2009

(65) Prior Publication Data
US 2010/0193819 A1  Aug. 5, 2010

(30) Foreign Application Priority Data

Sep. 28, 2007  (DE) .......................... 10 2007 046 520

(51) Int. Cl.
*H01L 33/00* (2010.01)
(52) U.S. Cl.
USPC .... 257/100; 257/433; 257/434; 257/E23.055; 257/E23.065; 257/E51.02; 438/26; 438/28; 438/64; 438/65; 438/66
(58) Field of Classification Search
USPC .................. 257/88, 100, 433, 434, 667, 778, 257/E51.02, E23.177, E23.169, E21.503, 257/E21.511, E23.055, E23.065; 438/26, 438/28, 64–67, 108, 126
See application file for complete search history.

(56) References Cited

U.S. PATENT DOCUMENTS

| 5,753,969 | A | 5/1998 | Suzuya et al. |
| 6,506,980 | B2 | 1/2003 | Hashimoto |
| 7,339,262 | B2 * | 3/2008 | Son et al. ...................... 257/671 |
| 8,049,330 | B2 | 11/2011 | Tain et al. |
| 2001/0039076 | A1 * | 11/2001 | Hashimoto ................... 438/110 |
| 2003/0102527 | A1 | 6/2003 | Wang |
| 2004/0169451 | A1 * | 9/2004 | Oishi et al. ...................... 313/45 |
| 2004/0257797 | A1 * | 12/2004 | Suehiro et al. .................. 362/34 |
| 2005/0117334 | A1 | 6/2005 | Lee et al. |
| 2005/0264194 | A1 | 12/2005 | Ng et al. |
| 2006/0250800 | A1 | 11/2006 | Chang et al. |
| 2006/0268567 | A1 | 11/2006 | Jang et al. |

(Continued)

FOREIGN PATENT DOCUMENTS

| CN | 1928425 A | 3/2007 |
| EP | 1 367 655 A1 | 12/2003 |

(Continued)

*Primary Examiner* — A. Sefer
*Assistant Examiner* — Farid Khan
(74) *Attorney, Agent, or Firm* — DLA Piper LLP (US)

(57) ABSTRACT

A light-emitting surface element includes a connection device, a light-generating element having at least two electrical connections electrically conductively connected to assigned connection lines on the connection device, and at least one planar light-guiding element formed by injection-molding in a manner at least partly embedding an arrangement composed of connection device and light-generating element in the planar light-guiding element.

9 Claims, 5 Drawing Sheets

(56) References Cited

U.S. PATENT DOCUMENTS

| | | |
|---|---|---|
| 2007/0007542 A1 | 1/2007 | Fujiwara |
| 2007/0053179 A1* | 3/2007 | Pang et al. .................... 362/103 |
| 2007/0177380 A1 | 8/2007 | Schultz et al. |
| 2007/0215896 A1* | 9/2007 | Sun et al. ........................ 257/99 |
| 2008/0191231 A1* | 8/2008 | Park et al. ....................... 257/98 |
| 2008/0197376 A1 | 8/2008 | Bert et al. |
| 2010/0270571 A1* | 10/2010 | Seo ................................. 257/98 |

FOREIGN PATENT DOCUMENTS

| | | |
|---|---|---|
| TW | 1241043 | 10/2005 |
| TW | 1281269 | 5/2007 |
| TW | 1283468 | 7/2007 |
| WO | 98/23896 | 6/1998 |
| WO | 2006/089540 A2 | 8/2006 |
| WO | 2007/078103 A1 | 7/2007 |

* cited by examiner

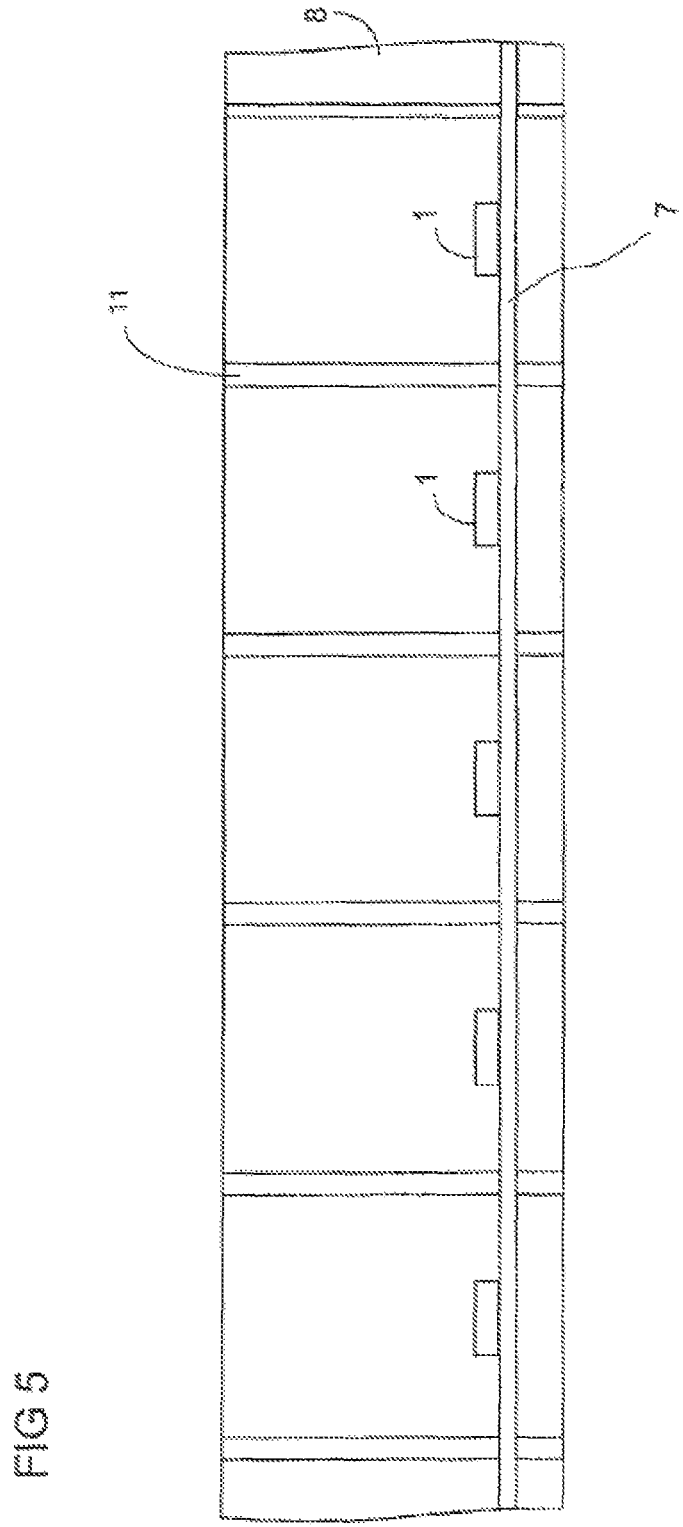

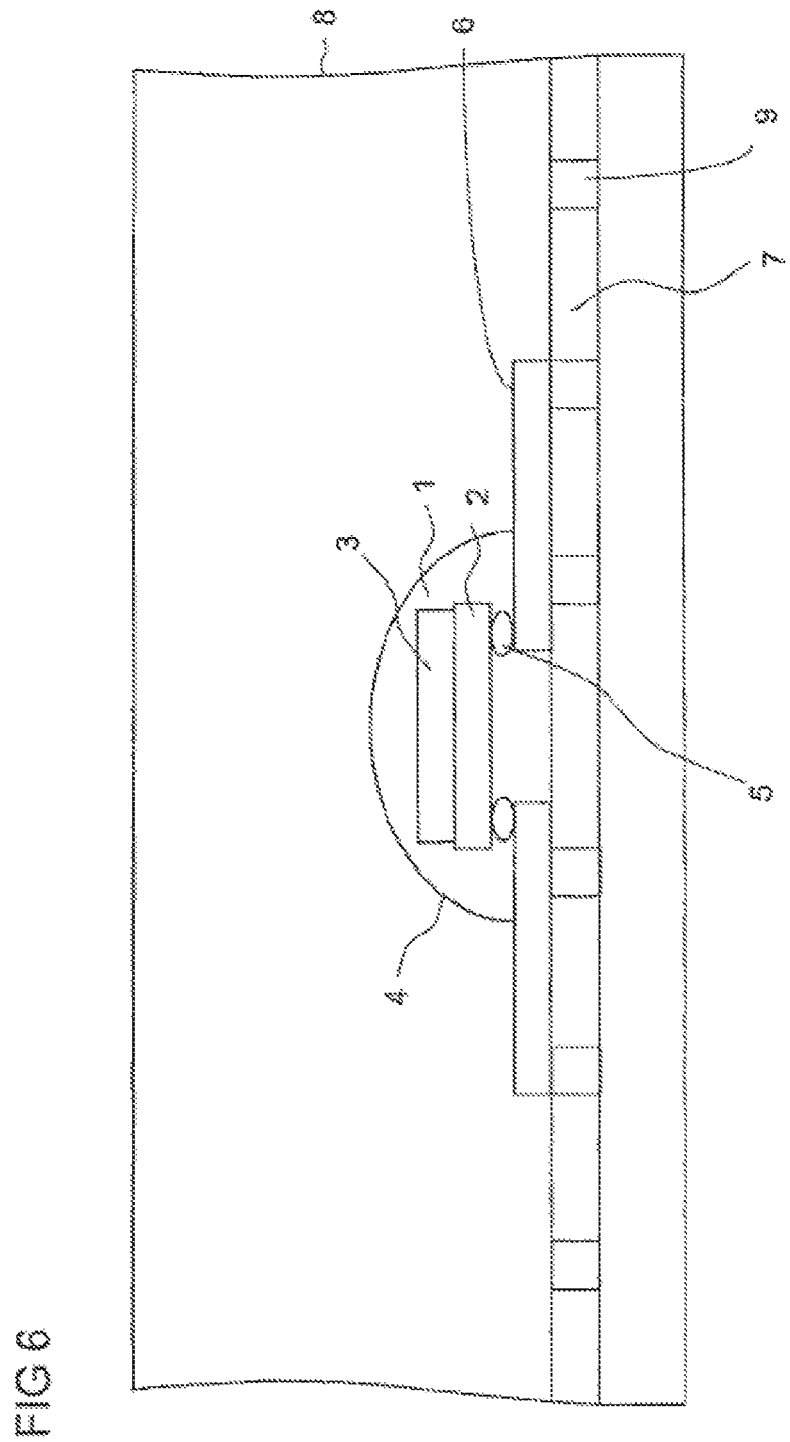

LIGHT-EMITTING SURFACE ELEMENT AND METHOD FOR PRODUCING A LIGHT-EMITTING SURFACE ELEMENT

RELATED APPLICATIONS

This is a §371 of International Application No. PCT/DE2008/001589, with an international filing date of Sep. 26, 2008 (WO 2009/039846 A1, published Apr. 2, 2009), which is based on German Patent Application No. 10 2007 046 520.5, filed Sep. 28, 2007, the subject matter of which is incorporated by reference.

TECHNICAL FIELD

This disclosure relates to a light-emitting surface element and to a method for producing a light-emitting surface element.

BACKGROUND

Light-emitting surface elements have acquired great importance in the recent past. Light-emitting surface elements are desired not just in cases where surfaces are to be illuminated areally as display elements, for example, but also in the case of a wide variety of types of displays. Particular importance is attached to a uniform luminous distribution of the light-emitting surface such that all regions are perceived equally. By way of example, LCD monitor and TFT displays, requiring areal transillumination, have existed for a relatively long time. However, light sources are generally in point or line form, such that the light has to be distributed over the surface for areal illumination. For this purpose, planar optical waveguides are known which, adapted to the distance from the light source by means of a corresponding surface treatment, couple the light out of the optical waveguide and cause it to be emitted.

For reasons of saving energy, in particular, it is endeavored to use conventional semiconductor components to generate light since they are highly efficient. Semiconductor components of this type are also known as LEDs.

It could therefore be helpful to provide a light-emitting surface element, and a method for producing the latter, which can be produced with high reliability in conjunction with low radiation losses.

SUMMARY

We provide a light-emitting surface element including a connection device, a light-generating element having at least two connections electrically conductively connected to assigned connection lines on the connection device, and at least one planar light-guiding element formed by injection-molding in a manner at least partly embedding an arrangement composed of connection device and light-generating element in the planar light-guiding element.

We also provide a method for producing a light-emitting surface element including providing a connection device, arranging a light-generating element on the connection device, and producing a planar light-guiding element by injection-molding in such a way that the light-generating element and the connection device are at least partly embedded into the light-guiding element.

BRIEF DESCRIPTION OF THE DRAWINGS

FIG. 5 shows the strip material illustrated in FIG. 3 after having been encapsulated by a planar light-guiding element by injection molding.

FIG. 6 shows a variant of the configuration illustrated in FIG. 1.

DETAILED DESCRIPTION

As a result of the production of the planar light-guiding element by the injection-molding method, a light-generating element and a connection device are embedded into the light-guiding element, such that, first, the coupling of light into the light-guiding element is made possible with high efficiency as a result of the avoidance of interfaces abutting one another and, second, it is possible to form a stable connection between the planar light-guiding element and the arrangement composed of connection device and light-generating element.

The provision of the light-generating element as "chip size package" makes it possible to mount the light-generating element easily and in a manner avoiding bonding wires that impede the mounting, and to have available a free surface via which the light is coupled into the planar light-guiding element.

The provision of a light-emitting diode as light-generating element makes it possible to generate light in the desired color by means of a suitable choice, such that different colored-luminous surfaces can be obtained with the same planar light-guiding element and only one corresponding light-emitting diode has to be provided.

As a result of a conversion means being applied on the light-emitting diode mounted as "chip size package" on the connection device, the mounted arrangement is protected against impairments during injection molding. Furthermore, the coloration can thus be determined at a very late time in production.

Our elements and methods are described below on the basis of examples with reference to the drawings. Identical reference symbols indicate identical elements in the individual figures, but the illustrations do not show relationships to scale.

Figure 1:
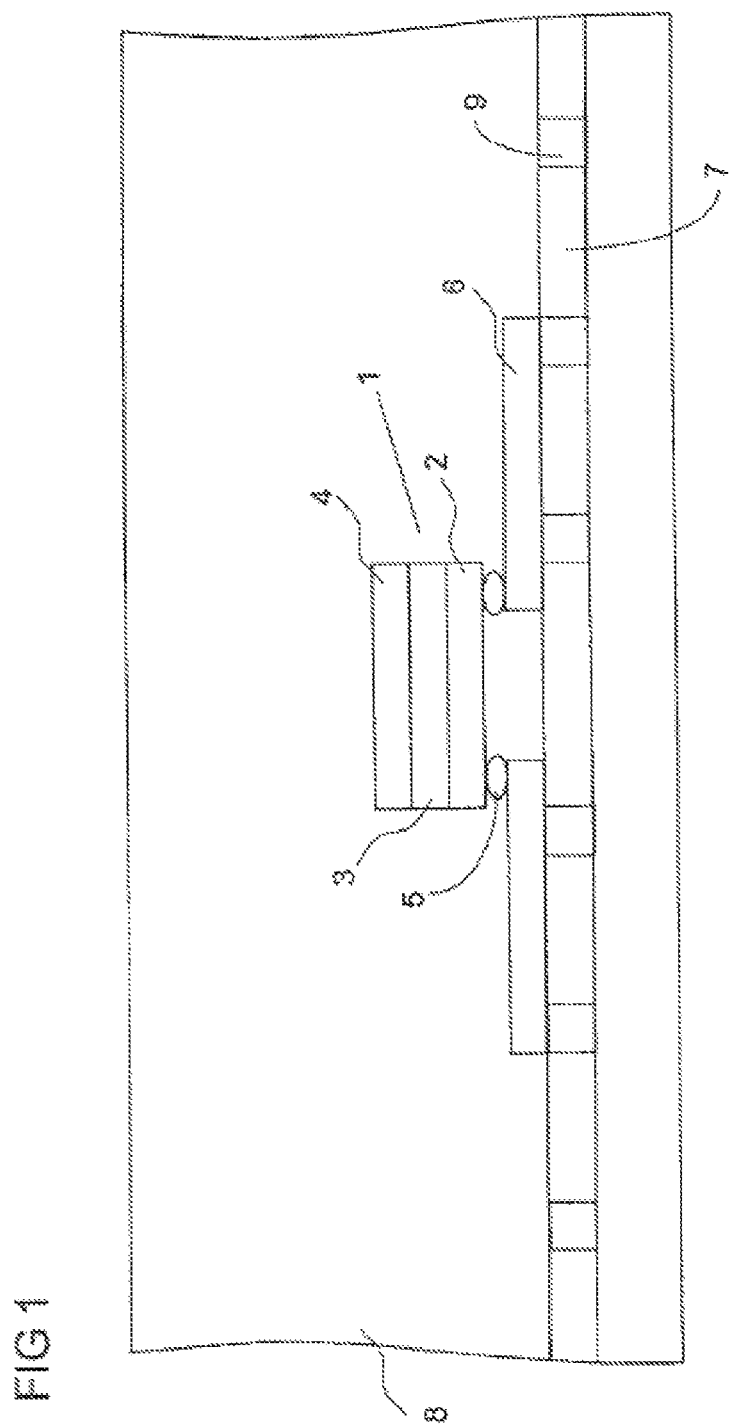
FIG. 1 shows a light-emitting surface element in a partial side view.

FIG. 1 shows an example wherein a flexible strip material 7 is provided, which has through openings 9 spaced apart at a constant distance. Conductor tracks 6 composed of electrically conductive material are applied on the strip material 7. This application process can be effected for example by printing technology or by lamination. In this case, the conductor track 6 can either firstly be applied over the whole area and then acquire the desired form by means of an etching method, for example, or be applied directly in the desired form. Printing technology, in particular, is recommended for the latter option.

Furthermore, provision is made of a light-generating element such as an LED 3, for example, which is formed as a so-called "chip size package," alternatively called CSP 1. In this case, CSP 1 consists of a carrier 2 on which the LED 3 is formed. The connection contact-making of the LED 3 is provided on the carrier 2 in a manner not illustrated in detail. The carrier 2 in turn has connection contacts connected to the conductor tracks 6, for example, by means of flexible bumps 5. During operation, the LED 3 is then intended to emit visible electromagnetic radiation from the side remote from the carrier 2.

As an option, provision is made for applying a conversion layer 4 on this surface which emits the light, the conversion layer altering the coloration of the light. This means that the wavelength of the emitted light is converted into a light having a different wavelength. In this way, by way of example, blue light emitted by an LED can be converted into white light with high efficiency.

The arrangement described up to this point, composed of CSP 1 and strip material 7 provided with conductor track 6, is then surrounded by a planar light-guiding element 8, such that the arrangement is embedded in the planar light-guiding element 8. This embedding is preferably effected in the form such that the preassembled arrangement composed of CSP 1 and strip material 7 is introduced into an injection mold and the injection mold is then filled by a thermoplastic material. During injection molding, the thermoplastic material also penetrates through the through openings 9, thus resulting in an intimate and stable connection between the planar light-guiding element 8 and the strip material 7 after curing.

Figure 2:
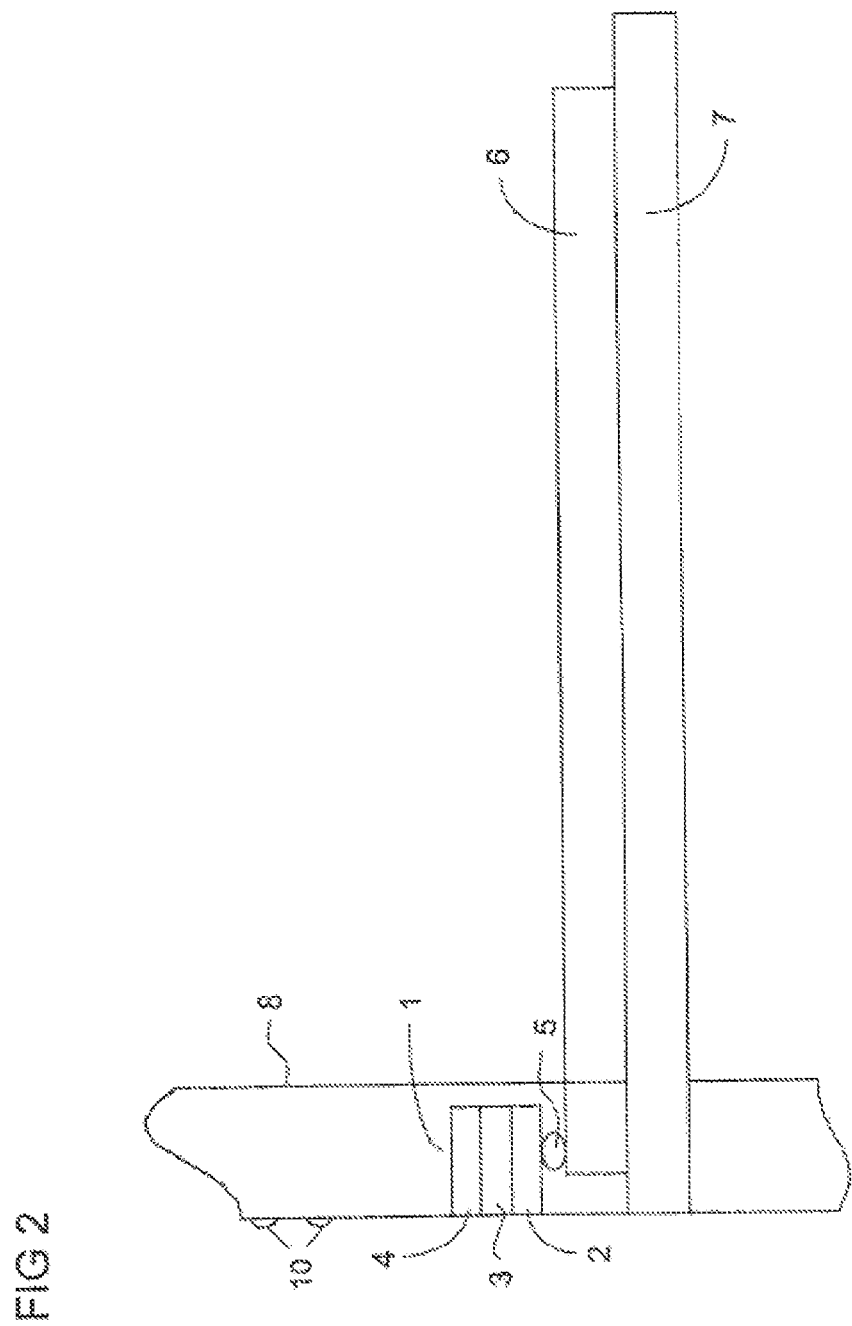
FIG. 2 shows the light-emitting surface element illustrated in FIG. 1 as rotated by 90 degrees in a partial view.

FIG. 2 shows this arrangement again in a manner rotated by 90 degrees. It can be discerned here that the planar light-guiding element 8 has approximately the thickness of the CSP 1. The extent to which the planar light-guiding element 8 extends further on that side of the strip material 7 which is remote from the CSP depends solely on mechanical preconditions.

Since the light is emitted from that side of the LED 3 which is remote from the carrier, the light does not propagate and is not passed on below the strip material 7. For reasons of stability or for reasons of shaping, however, it may be desired to provide the injection-molded material not only as far as penetration through the strip material, but also beyond that, as is indicated in the figures.

Two small elevations 10 are indicated at the surface of the light-guiding planar element 8. The elevations are intended to indicate surface configurations by means of which the light is coupled out. Normally, the light emitted by the LED is guided in the planar light-guiding element 8 and reflected inward again as soon as the light impinges on the outer edge. If the light passes to locations which are identified by the reference symbol 10 and modulate the surface, an altered angle of incidence is present for the light coming from inside at the surface such that the light is no longer reflected inward, but rather is emitted outward. In this way, the emission at the surface of the planar light-guiding element can be set by means of a corresponding configuration of the surface.

Figure 3:
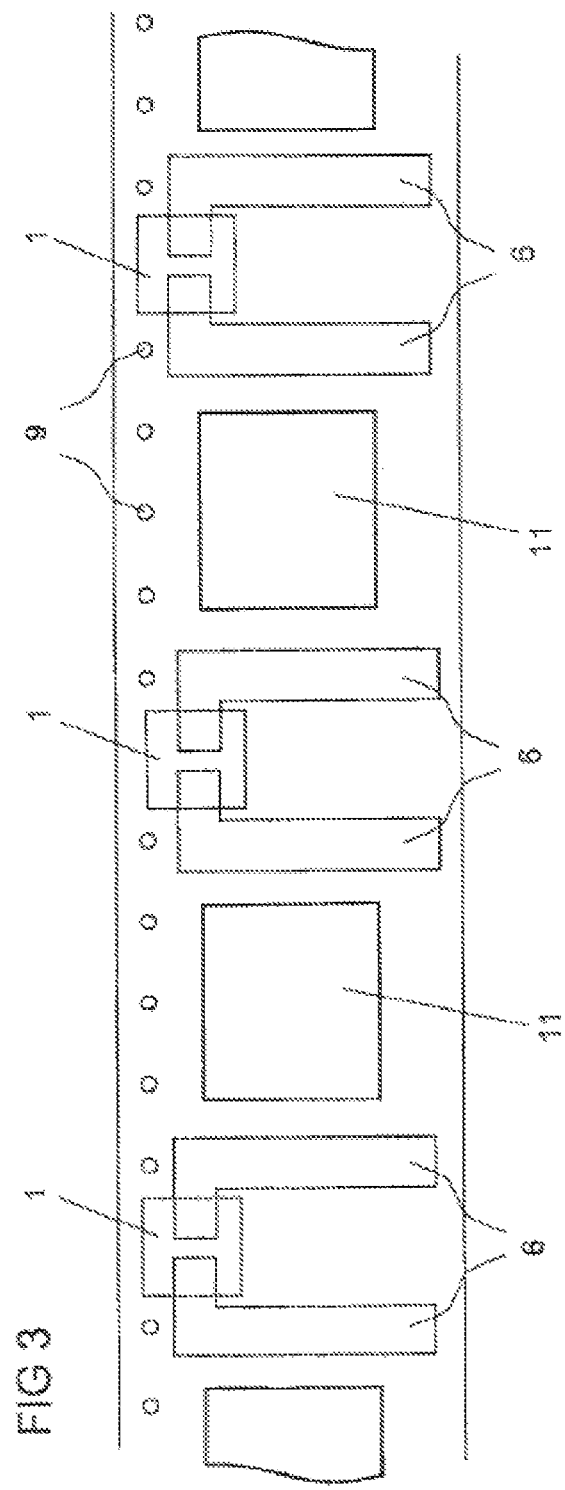
FIG. 3 shows a plan view of the arrangement of light-emitting diodes on a strip-type connection device.

FIG. 3 shows the strip material 7 with the through openings 9 in plan view. Conductor tracks 6 are led in pairs at uniform distances, the conductor tracks being led more closely to one another at the location at which a CSP 1 is provided for mounting. Over and above their function described with reference to FIGS. 1 and 2, the through openings 9 are also advantageous when the strip material 7 is populated in a manner coming from a roll and is then intended to be rolled up again. The through openings 9 can then be used for exact transport and/or for exact positioning of the strip 7. This also holds true, of course, when the strip material 7 is introduced into the injection mold and positioned there. The window openings 11 serve to ensure that, during the injection molding, the planar light-guiding element can extend around the strip material 7 and in this case, as can be discerned in FIG. 2, projects only insignificantly further beyond the CPS 1.

In FIG. 5, this more or less continuous arrangement from FIG. 3 is illustrated in a more highly simplified manner in a view corresponding to FIG. 1. The planar light-guiding element can be formed as it were correspondingly continuously like the strip and be divided at desired distances for the purpose of separation after curing. In accordance with FIG. 5, a separating gap 10 is illustrated in each case centrally between two CSPs 1, along which gap the individual light-emitting planar element is separated. This can be done by means of a suitable cutting method, for example.

However, it is also conceivable either for a respective injection mold to be used for an individual light-emitting surface element or for the injection mold to be configured in such a way that it has tapered portions or partitions, such that the individual light-emitting surface elements can correspondingly be separated by breaking-off, if appropriate, at the locations provided with the reference symbols 10 in FIG. 5.

Figure 4:
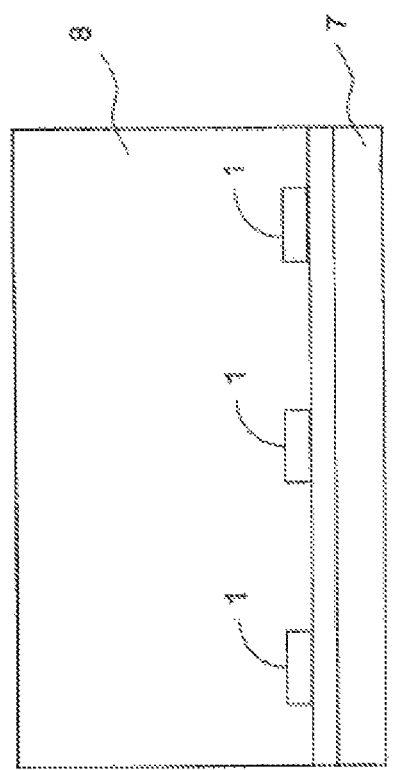
FIG. 4 shows a schematic illustration of a light-emitting surface element with a plurality of light-emitting diodes.

However, it is also not absolutely necessary that only an individual light-generating CSP 1 is provided for each light-emitting surface element. The number depends ultimately on the desired luminous intensity and the size of the surface to be formed and illuminated. In accordance with FIG. 4, this is indicated in a form such that three CSPs 1 are chosen in the case of the example illustrated in FIG. 4.

Referring to FIG. 1, it is indicated that a conversion layer 4 is applied on the LED 3 to convert the natural light generated by the LED into a desired light. In a configuration such as is illustrated in FIG. 6, the arrangement differs from the arrangement illustrated in FIG. 1 only insofar as initially the conversion layer 4 is absent. Instead of this, a conversion covering 4a is applied in a manner enveloping the CSP 1. This can be applied, for example, as a drop or in an injection method. Which method is ultimately chosen depends solely on the technical possibilities and on the state in which the CSP 1 is intended to be tested beforehand prior to mounting on the strip material.

The invention claimed is:

1. A light-emitting surface element comprising:
   a connection device formed from a strip material and connection lines arranged on the strip material and has openings at regular distances along a longitudinal extent, through which openings the planar light-guiding surface element projects integrally;
   a light-generating element comprising a light-emitting diode formed as a chip size package and having at least two connections electrically conductively connected to assigned connection lines on the connection device; and
   at least one planar light-guiding element formed by injection-molding in a manner at least partly embedding an arrangement composed of connection device and light-generating element in the planar light-guiding element, wherein light from the light-generating element propagates along the planar light-guiding element in a direction perpendicular to the strip material.

2. The light-emitting surface element as claimed in claim 1, wherein the chip size package has a carrier with connection elements and lying on the carrier a light-emitting diode chip electrically conductively connected to the connection elements.

3. The light-emitting surface element as claimed in claim 1, wherein a light-emitting region of the light-generating element is covered by a converter that converts the light emitted with a first wavelength by the light-generating element into a light having a wavelength different therefrom.

4. The light-emitting surface element as claimed in claim 3, wherein the converter is formed as a layer covering the light-emitting region on the chip.

5. The light-emitting surface element as claimed in claim 3, wherein the converter is formed in a manner covering the chip size package on the carrier.

6. The light-emitting surface element as claimed in claim 1, wherein a plurality of light-generating elements are provided on the connection device.

7. The light-emitting surface element as claimed in claim 2, wherein a light-emitting region of the light-generating element is covered by a converter that converts the light emitted with a first wavelength by the light-generating element into a light having a wavelength different therefrom.

8. A method for producing a light-emitting surface element comprising:
- providing a connection device;
- arranging a light-generating element on the connection device; and
- producing a planar light-guiding element by injection-molding in such a way that the light-generating element and the connection device are at least partly embedded into the light-guiding element, wherein the planar light-guiding element projects vertically with respect to the surface of the connection device and in the propagating direction of generated light.

9. The method as claimed in claim 8, wherein the connection device is provided as a continuous material, and the individual light-emitting surface element is separated after curing of the injection-molded planar light-guiding elements.

* * * * *

UNITED STATES PATENT AND TRADEMARK OFFICE
CERTIFICATE OF CORRECTION

PATENT NO. : 8,541,809 B2  Page 1 of 1
APPLICATION NO. : 12/679774
DATED : September 24, 2013
INVENTOR(S) : Sorg et al.

It is certified that error appears in the above-identified patent and that said Letters Patent is hereby corrected as shown below:

In the Claims

In Column 4

At claim 1, at line 42, please change "the planar" to --a planar--.

In Column 5

At claim 9, at line 27, please change "elements" to --element--.

Signed and Sealed this
Twenty-seventh Day of May, 2014

Michelle K. Lee
*Deputy Director of the United States Patent and Trademark Office*